(12) United States Patent
Thakur

(10) Patent No.: US 12,255,596 B2
(45) Date of Patent: Mar. 18, 2025

(54) FILTER CIRCUIT

(71) Applicant: Renesas Electronics Corporation, Tokyo (JP)

(72) Inventor: Nishant Singh Thakur, Broxbourne (GB)

(73) Assignee: Renesas Electronics Corporation, Tokyo (JP)

(*) Notice: Subject to any disclaimer, the term of this patent is extended or adjusted under 35 U.S.C. 154(b) by 228 days.

(21) Appl. No.: 18/082,762

(22) Filed: Dec. 16, 2022

(65) Prior Publication Data

US 2024/0204754 A1    Jun. 20, 2024

(51) Int. Cl.
*H03H 11/12*    (2006.01)
*H03H 7/01*    (2006.01)
*H03H 17/02*    (2006.01)

(52) U.S. Cl.
CPC ...... *H03H 11/1291* (2013.01); *H03H 7/0161* (2013.01); *H03H 17/0294* (2013.01)

(58) Field of Classification Search
CPC ............. H03H 11/1291; H03H 7/0161; H03H 17/0294; H03H 2210/02; H03H 2210/021; H03H 2210/023; H03H 2210/025

USPC .......................................................... 327/553
See application file for complete search history.

(56) References Cited

U.S. PATENT DOCUMENTS

| | | | |
|---|---|---|---|
| 6,356,386 B1* | 3/2002 | Denkin | H04J 14/0221 398/79 |
| 7,443,229 B1* | 10/2008 | Vinciarelli | H02M 1/32 327/531 |
| 10,727,732 B1* | 7/2020 | Ortiz | H02M 1/14 |
| 10,862,389 B1* | 12/2020 | Ortiz | H02M 1/15 |
| 2016/0211750 A1* | 7/2016 | Coleman | H02M 3/158 |
| 2016/0248328 A1* | 8/2016 | Zhang | H02M 1/08 |
| 2017/0207723 A1* | 7/2017 | Zhang | H02M 1/12 |
| 2020/0266769 A1* | 8/2020 | Gurlahosur | H03F 1/30 |

\* cited by examiner

*Primary Examiner* — William Hernandez
(74) *Attorney, Agent, or Firm* — SCULLY, SCOTT, MURPHY & PRESSER, P.C.

(57) ABSTRACT

A filter circuit for use with a system configured to be coupled with an electrical load, the filter circuit comprising a first filter, wherein the first filter is configured to receive a first voltage and provide an output voltage, the output voltage being the first voltage after filtering by the first filter, and the filter circuit is configured to adjust the bandwidth of the first filter in response to a load transient.

15 Claims, 10 Drawing Sheets

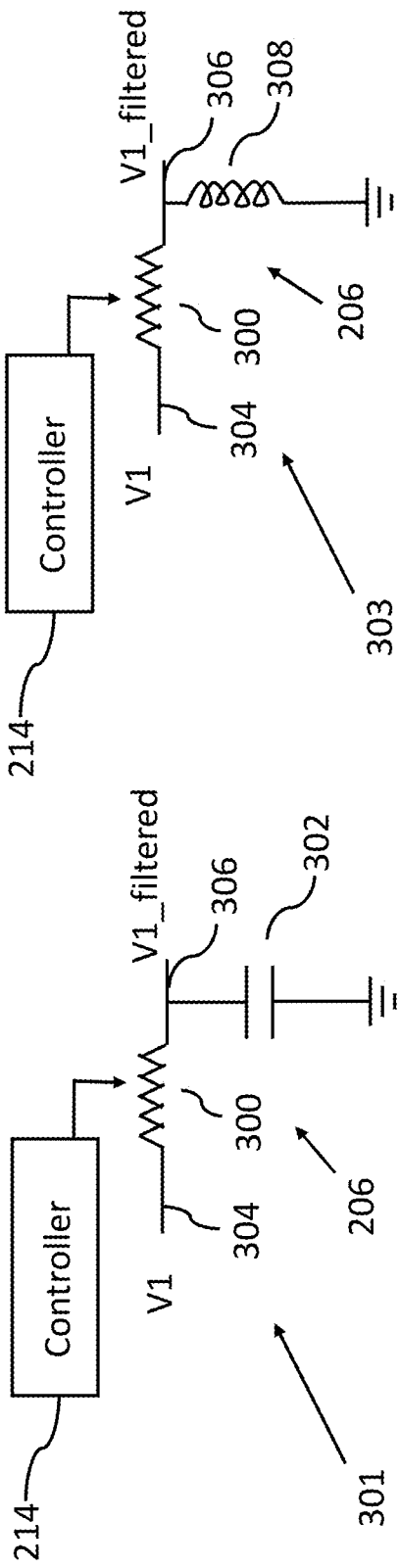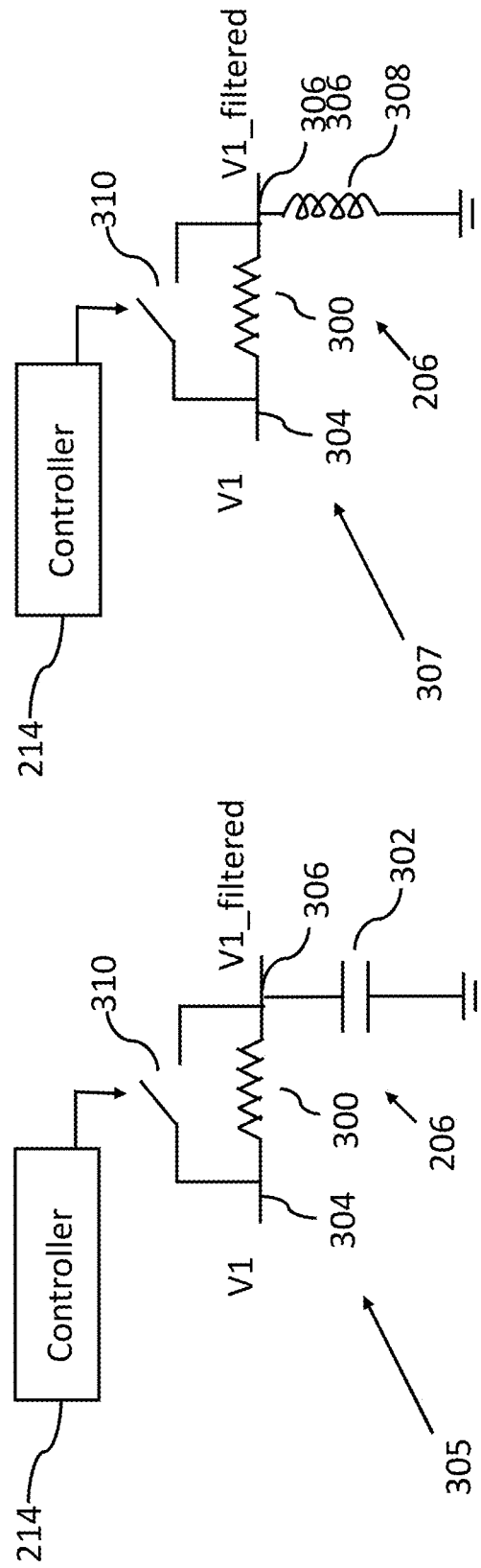
Figure 3(a) Figure 3(b) Figure 3(c) Figure 3(d)

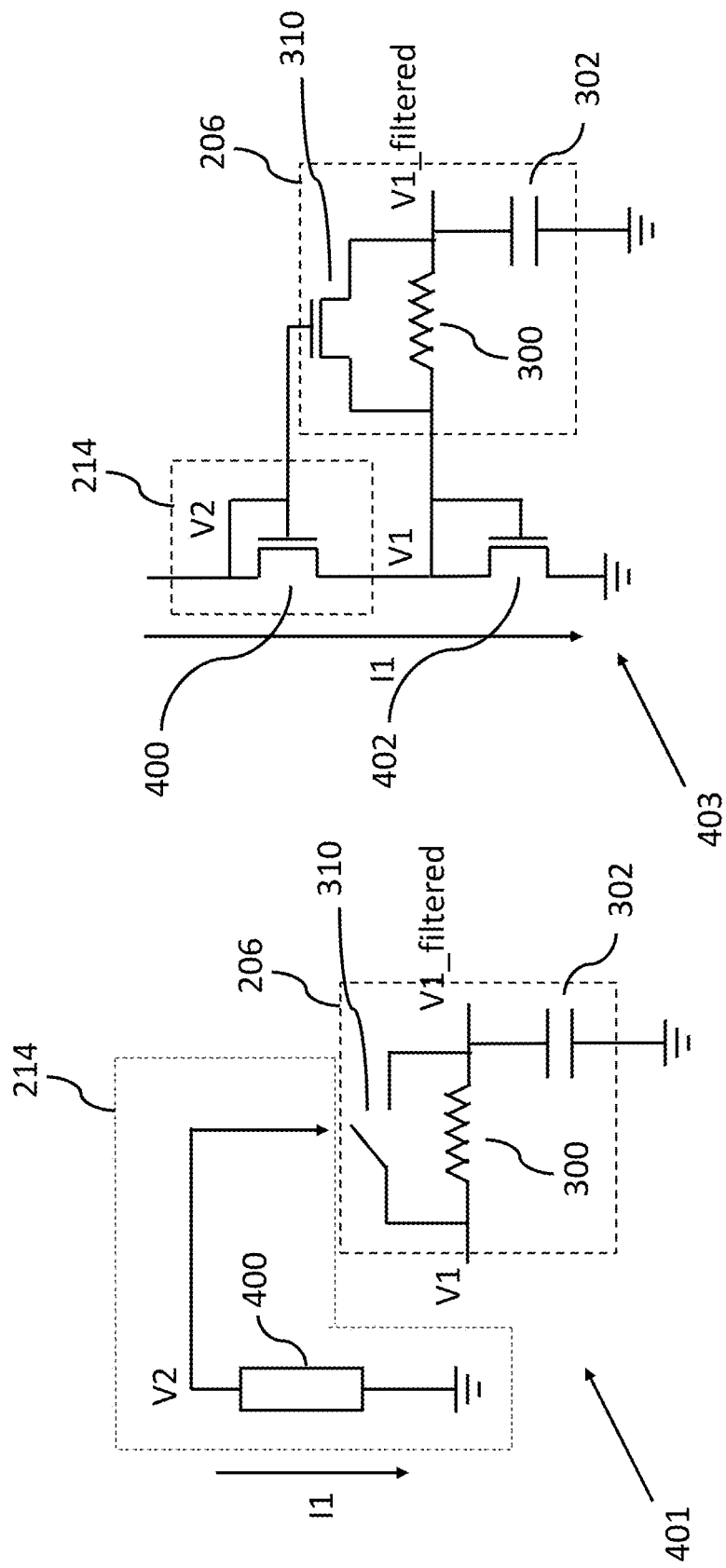

FILTER CIRCUIT

The present disclosure relates to a filter circuit. In particular, the present disclosure relates to a filter circuit for use with a system configured to be coupled with an electrical load.

BACKGROUND

FIG. 1(a) is a schematic of a known low dropout regulator LDO 100 with a low pass RC filter 102. The LDO 100 is an ultra-low power 30 nA LDO.

The LDO 100 comprises an amplifier 104; transistors 106, 108, 110; a capacitor 112; resistors 114, 116 and is coupled to a load capacitor 118 with an equivalent series resistance 120. The low pass filter 102 comprises a resistor 122, a capacitor 124 and a transistor 126. FIG. 1(b) is a schematic of the low pass filter 102.

In low power systems, such as the LDO 100, adaptive current biasing is a very widely and abundantly used technique. For example, in an ultra-low power 30 nA LDO 100 there is load-dependent adaptive current biasing of the error amplifier 104. The 30 nA LDO 100 can supply from 0 to 10 mA current.

The LDO 100 uses load current dependent adaptive biasing in the error amplifier 104. Adaptive current biasing reduces power consumption when the load current is low and increases the amplifier bias current (ibias) when load current increases, thereby increasing the amplifier bandwidth and keeping it stable.

However, as load current increases bias current ibias increases, which is positive feedback and can make the system unstable. To keep the system stable, the bandwidth of the positive feedback system should be lower than the negative feedback loop of the LDO 100. The simplest way to achieve a lower bandwidth for a positive feedback path is to insert a low pass filter in the path as shown in FIG. 1(a). The low pass filter 102 acts to keep the bandwidth of the positive feedback loop smaller than the negative feedback loop, thereby improving stability of the overall system.

SUMMARY

It is desirable to further improve the stability of systems, such as an LDO, under different operating conditions.

According to a first aspect of the disclosure there is provided a filter circuit for use with a system configured to be coupled with an electrical load, the filter circuit comprising a first filter, wherein the first filter is configured to receive a first voltage and provide an output voltage, the output voltage being the first voltage after filtering by the first filter, and the filter circuit is configured to adjust the bandwidth of the first filter in response to a load transient.

Optionally, the first filter comprises one of a high pass filter, a low pass filter, a bandstop filter, or a bandpass filter.

Optionally, the filter circuit is configured to adjust the bandwidth of the first filter in response to a falling load transient and/or a rising load transient.

Optionally, the filter circuit is configured to adjust the bandwidth of the first filter in response to the falling load transient or the rising load transient and to maintain the bandwidth at its current value in response to the other of the falling load transient or the rising load transient.

Optionally, the filter circuit is configured to temporarily adjust the bandwidth of the first filter in response to a falling load transient and/or a load transient from a first value to a second value before returning the bandwidth to the first value.

Optionally, the filter circuit is configured to temporarily adjust the bandwidth of the first filter in response to the falling load transient or the rising load transient from a first value to a second value before returning the bandwidth to the first value, and maintain the bandwidth at the first value in response to the other of the falling load transient or the rising load transient.

Optionally, the filter circuit comprises a controller configured to detect the load transient, and to adjust the bandwidth of the first filter in response to the load transient as detected by the controller.

Optionally, the controller is configured to adjust a resistance of a first resistor of the first filter to adjust the bandwidth.

Optionally, the controller is configured to detect the load transient by detecting a transient in a load current.

Optionally, the first filter comprises a first switch, and the controller is configured to operate the first switch to bypass a portion of the first filter when a load transient is detected, thereby adjusting the bandwidth of the first filter in response to the load transient.

Optionally, the first switch comprises a first switch transistor.

Optionally, the controller is configured to detect the load transient by detecting a transient in a load current.

Optionally, the controller is configured to receive a first current, the first current being dependent on the load current.

Optionally, the controller comprises a first resistive element configured to receive the first current and to generate a second voltage, and the controller is configured to operate the first switch using the second voltage.

Optionally, the first switch comprises a first switch transistor, the first switch transistor being configured to receive the second voltage at its gate.

Optionally, the first resistive element comprises a first resistive transistor configured to receive the first current and to generate the second voltage.

Optionally, the filter circuit is configured to receive the first voltage as generated by a second resistive element coupled in series with the first resistive element.

Optionally, the first resistive element comprises a first resistive transistor configured to receive the first current and to generate the second voltage, and/or the second resistive element comprises a second resistive transistor configured to receive the first current and to generate the first voltage.

Optionally, the first resistive element comprises a first resistive transistor configured to receive the first current to generate the second voltage, and a size ratio between the first resistive transistor and the first switch transistor is 100:1.

Optionally, the first filter comprises a low pass filter comprising a first resistor, and a first capacitor, wherein the first resistor comprises a first terminal for receiving the first voltage and a second terminal coupled to a first terminal of the first capacitor and for providing the output voltage.

Optionally, the first switch comprises a first switch transistor, the first switch transistor being configured to receive the second voltage at its gate.

Optionally, the first resistive element comprises a first resistive transistor configured to receive the first current and to generate the second voltage.

Optionally, the filter circuit is configured to receive the first voltage as generated by a second resistive element coupled in series with the first resistive element.

Optionally, the first resistive element comprises a first resistive transistor configured to receive the first current and to generate the second voltage, and/or the second resistive element comprises a second resistive transistor configured to receive the first current and to generate the first voltage.

Optionally, the first resistive element comprises a first resistive transistor configured to receive the first current to generate the second voltage, and a size ratio between the first resistive transistor and the first switch transistor is 100:1.

Optionally, the controller is configured to receive a first current, the first current being dependent on the load current.

Optionally, the filter circuit is configured to provide the output voltage that is dependent on the first current, wherein the system is configured to receive the output voltage and to generate a system bias current.

Optionally, the system configured to be coupled with an electrical load comprises a low dropout regulator for providing an LDO voltage.

Optionally, the low dropout regulator comprises an LDO transistor, a first LDO resistive element, a second LDO resistive element, and an amplifier, wherein the first LDO resistive element and the second LDO resistive element are coupled at a feedback node which is coupled to a first input terminal of the amplifier and is configured to provide a feedback voltage, the second LDO resistive element and the LDO transistor are coupled at an output node and is configured to provide the LDO voltage, an output terminal of the amplifier is coupled to a gate of the LDO transistor.

Optionally, the low dropout regulator comprises a stabilizing capacitor coupled between the output node and the feedback node.

Optionally, the LDO comprises a bias current transistor coupled to the amplifier and configured to receive the output voltage from the filter circuit at its gate and to generate an amplifier bias current, and to provide the amplifier bias current to the amplifier.

Optionally, the filter circuit comprises a controller configured to detect the load transient, and to adjust the bandwidth of the first filter in response to the load transient as detected by the controller.

Optionally, the first filter comprises a first switch, and the controller is configured to operate the switch to bypass a portion of the first filter when a load transient is detected, thereby adjusting the bandwidth of the first filter in response to the load transient.

Optionally, the controller is configured to detect the load transient by detecting a transient in a load current.

Optionally, the controller is configured to receive a first current, the first current being dependent on the load current.

Optionally, the controller comprises a first resistive element configured to receive the first current and to generate a second voltage, and the controller is configured to operate the first switch using the second voltage.

Optionally, the first filter comprises a low pass filter comprising a first resistor, and a first capacitor, wherein the first resistor comprises a first terminal for receiving the first voltage and a second terminal coupled to a first terminal of the first capacitor and for providing the output voltage.

Optionally, the first switch comprises a first switch transistor, the first switch transistor being configured to receive the second voltage at its gate.

Optionally, the first resistive element comprises a first resistive transistor configured to receive the first current and to generate the second voltage.

Optionally, the filter circuit is configured to receive the first voltage as generated by a second resistive element coupled in series with the first resistive element.

Optionally, the first resistive element comprises a first resistive transistor configured to receive the first current and to generate the second voltage, and/or the second resistive element comprises a second resistive transistor configured to receive the first current and to generate the first voltage.

Optionally, the first resistive element comprises a first resistive transistor configured to receive the first current to generate the second voltage, and a size ratio between the first resistive transistor and the first switch transistor is 100:1.

Optionally, the first current is provided by a sensing transistor coupled in series with the first resistive element and comprising a gate coupled to a gate of the LDO transistor.

According to a second aspect of the disclosure there is provided an apparatus comprising a system configured to be coupled with an electrical load, and a filter circuit comprising a first filter, wherein the first filter is configured to receive a first voltage and provide an output voltage, the output voltage being the first voltage after filtering by the first filter, and the filter circuit is configured to adjust the bandwidth of the first filter in response to a load transient.

Optionally, the system comprises a low dropout regulator for providing an LDO voltage to an electrical load.

It will be appreciated that the apparatus of the second aspect may include features set out in the first aspect and can incorporate other features as described herein.

According to a third aspect of the disclosure there is provided a method of filtering using a filter circuit for use with a system configured to be coupled with an electrical load, the method comprising receiving a first voltage using a first filter, providing an output voltage using the first filter, the output voltage being the filtered first voltage, and adjusting the bandwidth of the first filter in response to a load transient.

It will be appreciated that the method of the third aspect may include features set out in the first aspect and/or second aspect and can incorporate other features as described herein.

BRIEF DESCRIPTION OF THE DRAWINGS

The disclosure is described in further detail below by way of example and with reference to the accompanying drawings in which:

FIG. 3(a) is a schematic of a filter circuit in accordance with a third embodiment of the present disclosure, FIG. 3(b) is a schematic of a filter circuit in accordance with a fourth embodiment of the present disclosure, FIG. 3(c) is a schematic of a filter circuit in accordance with a fifth embodiment of the present disclosure, FIG. 3(d) is a schematic of a filter circuit in accordance with a sixth embodiment of the present disclosure;

FIG. 4(a) is a schematic of a filter circuit in accordance with a seventh embodiment, FIG. 4(b) is a schematic of a filter circuit in accordance with an eighth embodiment of the present disclosure.

DETAILED DESCRIPTION

Figure 1B:
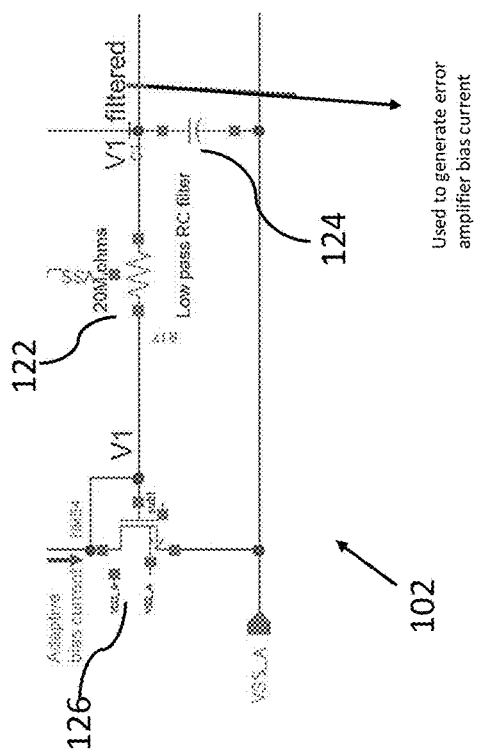
FIG. 1(b) is a schematic of the low pass filter.
Figure 1A:
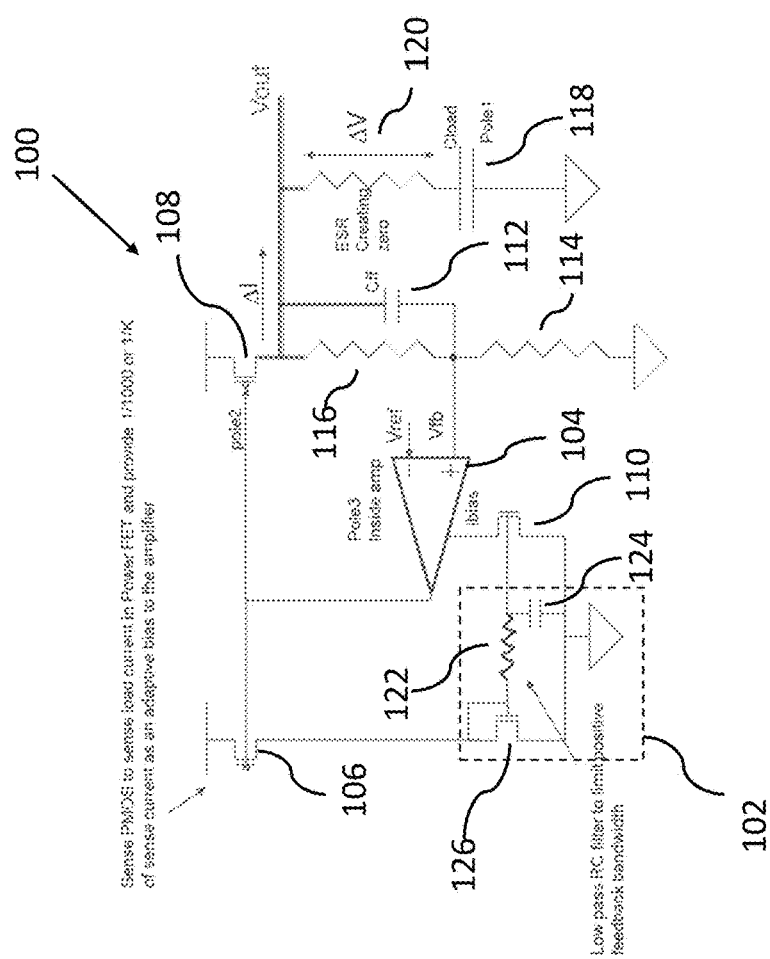
FIG. 1(a) is a schematic of a known low dropout regulator.

Referring to FIG. 1(a) and the LDO 100, during load transients we want the adaptive bias current ibias of the amplifier 104 to quickly increase so that load transient performance can be suitably high, but a traditional RC filter, such as the filter 102, will not pass a fast signal.

During a load transient a large current will be dumped into the adaptive bias current ibias. Voltage jump on V1 will not pass to V1_filtered immediately due to the RC filter 102 and hence amplifier bias current ibias will take time to increase, limiting amplifier's 104 response time.

In summary, during a load transient this low pass filter 102 will not allow the amplifier bias current ibias to change quickly.

During a load transient, a load current increase moves a load pole to a higher frequency. The poles and zeros of feedback loop will take time to settle to a new value and we will see ringing in an output of LDO 100 for some time. Therefore, the LDO 100 will remain unstable and show ringing until the RC filter 102 lets the adaptive bias current ibias reach the amplifier 104 which moves the amplifier 104 pole and zeros to a higher frequency.

Therefore, a load transient droop in the output voltage Vout of LDO can be very high and exhibit ringing/oscillations.

In summary, during a load transient, the filter 102 cannot respond quickly enough, thereby resulting in instability of the LDO system. It is therefore desirable to provide a filter circuit that can provide stability during a load transient.

Figure 2B:
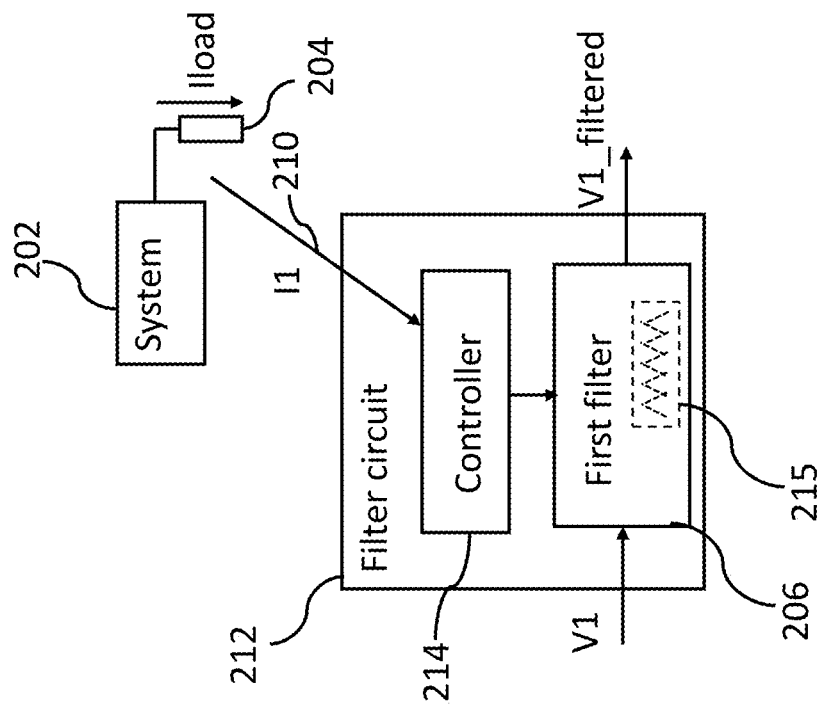
FIG. 2(b) is a schematic of a filter circuit in accordance with a second embodiment of the present disclosure.
Figure 2A:
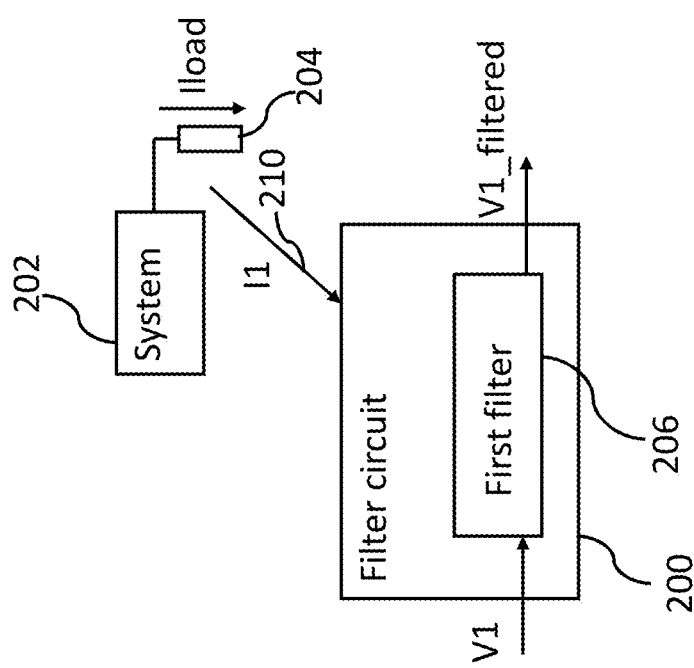
FIG. 2(a) is a filter circuit in accordance with a first embodiment of the present disclosure.

FIG. 2(a) is a filter circuit 200 for use with a system 202 configured to be coupled with an electrical load 204 in accordance with a first embodiment of the present disclosure. The filter circuit 200 comprises a first filter 206 that is configured to receive a voltage V1 and provide an output voltage V1_filtered. The output voltage V1_filtered is the voltage V1 after filtering by the first filter 206. The filter circuit 200 is configured to adjust the bandwidth of the first filter 206 in response to a load transient.

In FIG. 2(a), an arrow labelled using reference numeral 210 is used to denote information relating to the load transient being provided from the system 202 to the filter circuit 200.

The first filter 206 may comprise one or more of a high pass filter, a low pass filter, a bandstop filter and a bandpass filter.

In a specific embodiment the filter circuit 200 may be configured to adjust the bandwidth of the first filter 206 in response to a falling load transient and/or a rising load transient. Adjustment for both rising and falling load transients may be referred to as "bidirectional" operation.

In a further embodiment, the filter circuit 200 may be configured to adjust the bandwidth of the first filter 206 in response to a falling load transient with the bandwidth being maintained at its current value in response to a rising load transient. This may be referred to as "unidirectional" operation.

In a further embodiment, the filter circuit 200 may be configured to adjust the bandwidth of the first filter 206 in response to a rising load transient with the bandwidth being maintained at its current value in response to a falling load transient. This may be referred to as "unidirectional" operation.

In a specific embodiment, the filter circuit 200 may be configured to temporarily adjust the bandwidth of the first filter 206 in response to a falling load transient and/or a load transient from a first value to a second value before returning the bandwidth to the first value.

In a further specific embodiment, the filter circuit 200 may be configured to temporarily adjust the bandwidth of the first filter in response to the falling load transient or the rising load transient from a first value to a second value before returning the bandwidth to the first value, and to maintain the bandwidth at the first value in response to the other of the falling load transient or the rising load transient.

It will be appreciated that the embodiments disclosed herein may provide unidirectional operation or bidirectional operation, in accordance with the understanding of the skilled person. Furthermore, it will be appreciated that the embodiments disclosed herein may provide a temporary adjustment to the bandwidth in response to a load transient, and in accordance with the understanding of the skilled person.

By adjusting the first filter 206 bandwidth in response to a load transient, the filter circuit 200 can respond quickly, thereby providing a means of improving stability when used with a system such as the LDO 100 and when a load transient occurs.

FIG. 2(b) is a schematic of a filter circuit 212 in accordance with a second embodiment of the present disclosure. The filter circuit 212 comprises a controller 214 configured to detect the load transient and to adjust the bandwidth of the first filter 206 in response to the load transient as detected by the controller 214.

In a specific embodiment, the first filter 206 may comprise a resistor 256, with the bandwidth of the first filter 206 being adjustable based on the resistance of the resistor. In such an embodiment, the controller may be configured to adjust the resistance of the resistor 256 to adjust the bandwidth of the first filter 206. The resistor 215 may, for example, be a variable resistor.

The controller 214 may be configured to detect the load transient by detecting a transient in a load current Iload. The controller 214 may be configured to receive a first current I1 that is dependent on the load current Iload, such that the arrow 210 may denote the first current I1 being provided to the controller 214.

Figure 2D:
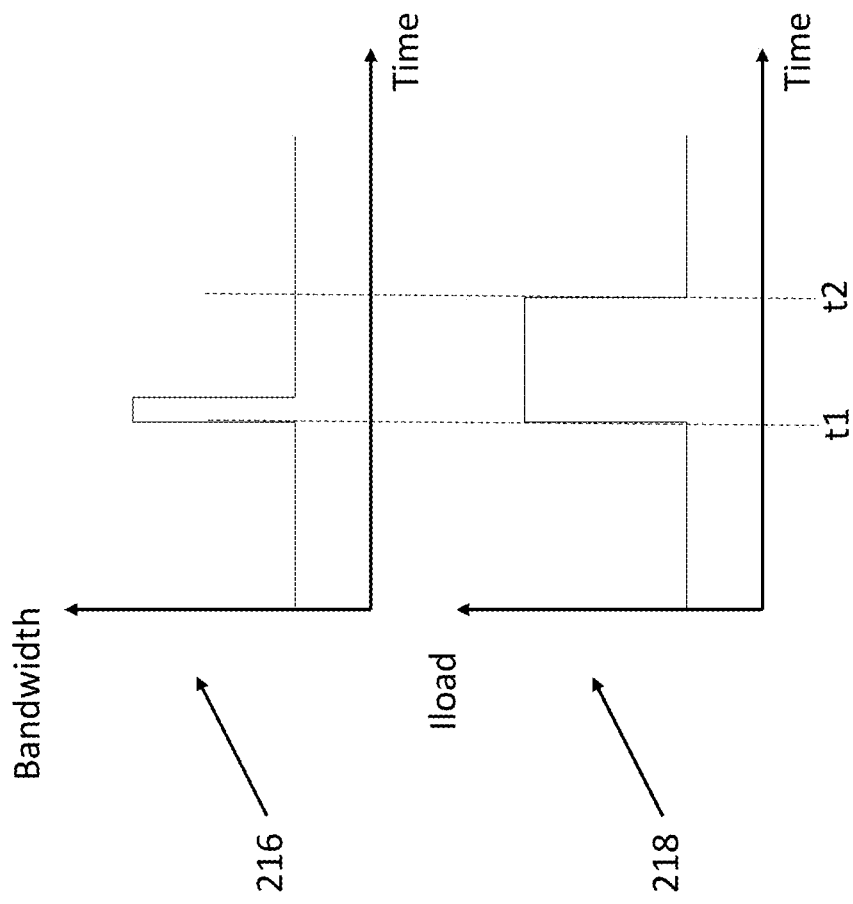
FIG. 2(d) shows the graph of FIG. 2(c) alongside a graph showing bandwidth versus time.
Figure 2C:
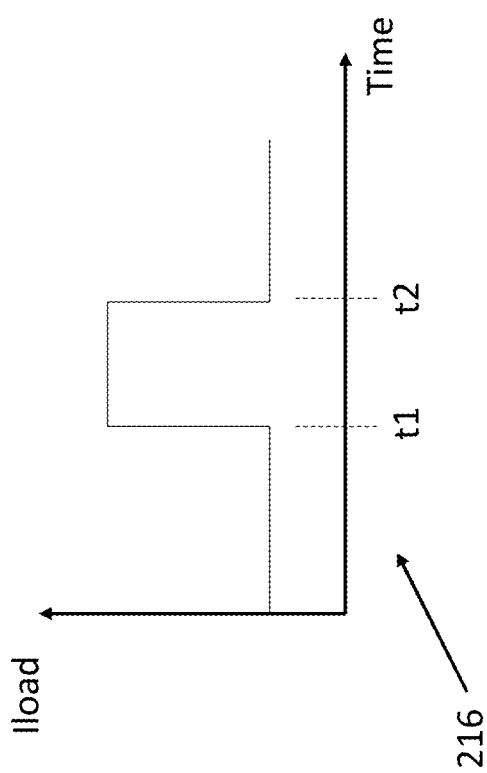
FIG. 2(c) is a graph of load current versus time for an implementation of the system.

FIG. 2(c) is a graph 216 of load current Iload versus time for an implementation of the system 202, which may be an LDO. At a time t1 there is a rising load transient and a time t2 there is a falling load transient. The load current Iload may increase when there is an increased power draw from the electrical load 204, with the load current Iload falling when the power draw decreases.

FIG. 2(d) shows the graph 216 alongside a graph 218 showing bandwidth versus time. The bandwidth on the graph 218 is the bandwidth of the first filter 206. In the present example the bandwidth temporarily increases when there is a rising load transient at the time t1 before return to its initial value, with the bandwidth maintaining its initial value when load current Iload falls. It will be clear that in further embodiments, the bandwidth may be adjusted when there occurs rising and/or falling load transients, as discussed previously.

The time period over which the bandwidth is raised before returning to its initial value may, for example, be 1 μs. However, it will be appreciated that in further embodiments the time period may be longer or shorter, in accordance with the understanding of the skilled person.

FIG. 3(a) is a schematic of a filter circuit 301 comprising a specific implementation of the first filter 206 where the first filter 206 comprises a low pass filter, and in accordance with a third embodiment of the present disclosure. The first filter 206 comprises a resistor 300 and a capacitor 302. The resistor 300 comprises a first terminal 304 for receiving the voltage V1 and a second terminal 306 for providing the output voltage V1_filtered. In the present embodiment, the controller 214, during operation, may adjust the resistance of the resistor 300 to adjust the bandwidth of the first filter 206. FIG. 3(b) is a schematic of a filter circuit 303 comprising a specific implementation of the first filter 206 where the first filter 206 comprises a high pass filter which comprises an inductor 308, and in accordance with a fourth embodiment of the present disclosure.

FIG. 3(c) is a schematic of a filter circuit 305 comprising specific implementation of the first filter 206 where the first filter 206 comprises a low pass filter, and in accordance with a fifth embodiment of the present disclosure. In the present embodiment, the first filter 206 comprises a switch 310. During operation, the controller 214, upon detection of a load transient, will operate the switch 310 to bypass a portion of the first filter 206, thereby adjusting the bandwidth of the first filter 206. The switch may comprise a switch transistor. FIG. 3(d) is a schematic of a filter circuit 307 comprising a specific implementation of the first filter 206 where the first filter 206 comprises a high pass filter and the switch 310, and in accordance with a sixth embodiment of the present disclosure.

FIG. 4(a) is a schematic of a filter circuit 401 comprising a specific implementation of the first filter 206 and the controller 214, and in accordance with a seventh embodiment of the present disclosure.

In the present embodiment, and subsequent embodiments, the first filter 206 comprises a low pass filter. It will be appreciated that further embodiments may comprise a high pass filter, or another filter, in accordance with the understanding of the skilled person.

In the present embodiment, the controller 214 comprises a resistive element 400 configured to receive the current I1 and to generate a voltage V2. The controller 214 is configured to operate the switch 310 using the voltage V2. The first current may be dependent on the load current Iload.

FIG. 4(b) is a schematic of a filter circuit 403 comprising a further specific implementation of the first filter 206 and the controller 214, and in accordance with an eighth embodiment of the present disclosure. The switch 310 comprises a switch transistor that receives the voltage V2 at its gate. The resistive element 400 may comprise a resistive transistor that is configured to receive the current I1 and to generate the voltage V2. In further embodiments, the resistive element 400 may comprise a poly resistor or a combination of both a poly resistor and a resistive transistor.

In operation, the filter circuit 206 receives the voltage V1 as generated by a resistive element 402 that is coupled in series with the resistive element 400. The resistive element 402 may comprise a resistive transistor configured to receive the current I1 and to generate the voltage V1. A size ratio between the resistive transistor 400 and the switch transistor 310 may be 100:1.

If resistive element 400 is a MOS, a specific ratio can be achieved by using different width/length (W/L) size for the transistor 400 and the transistor 310. The transistor 400 in a specific embodiment may be 5 μm/0.5 μm whereas the transistor 310 may be 0.5 μm/5 μm giving a ratio of 100:1. If resistive element 400 is a poly resistor or a combination of MOS and poly resistor it should generate a voltage V2 such that (V2-V1) in steady state does not turn on the switch transistor 310.

It will be appreciated that the ratio of 100:1 is an example ratio, and a higher or lower ratio may be used without affecting the principle of operation, in accordance with the understanding of the skilled person.

Figure 4C:
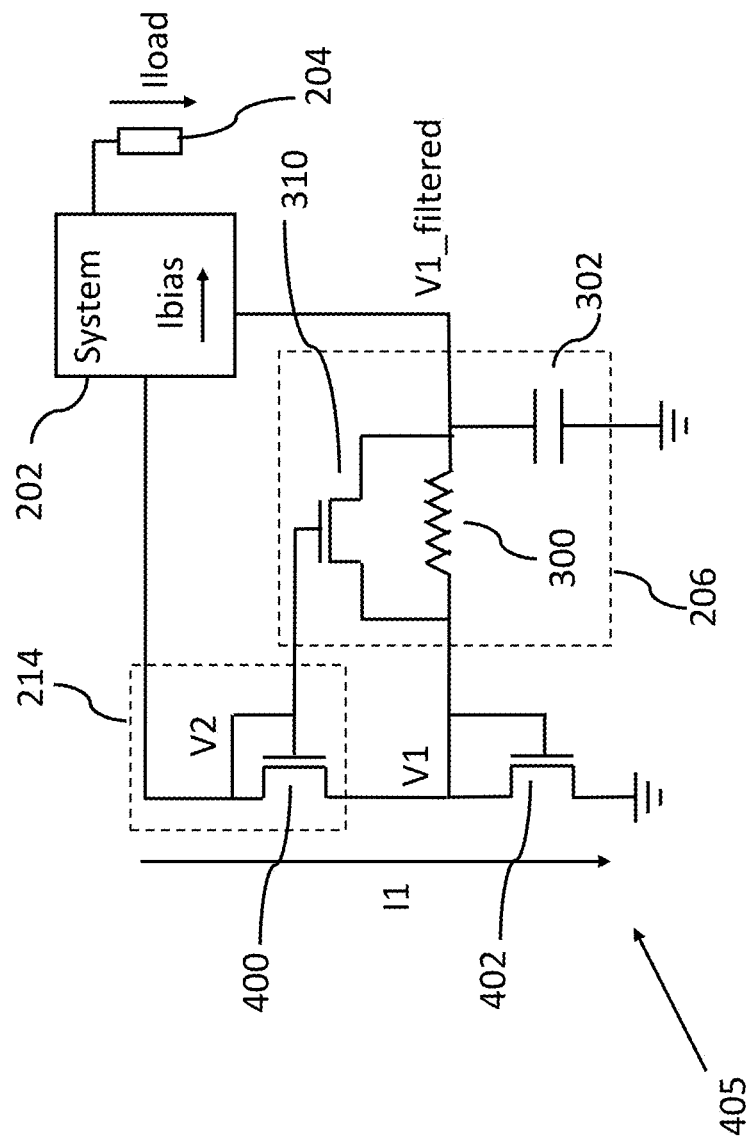
FIG. 4(c) is a schematic of a filter circuit in accordance with a ninth embodiment of the present disclosure.

FIG. 4(c) is a schematic of a filter circuit 405 in accordance with a ninth embodiment of the present disclosure. In the present embodiment, the filter circuit 405 is configured to provide the output voltage V1_filtered, which is dependent on the current I1, to the system 202. The system 202 is configured to receive the output voltage V1_filtered and to use the output voltage V1_filtered to generate a bias current Ibias.

Embodiments of the filter circuit disclosed herein, such as the filter circuit 405, may be used with a system such as the LDO 100. By using an embodiment of the filter circuit of the present disclosure for load current dependent adaptive biasing, it is possible to generate a bias current for the amplifier of the LDO 100 that varies with load current and also responds quickly to load transients, thereby improving stability compared with known systems.

Figures 4D, 4E:
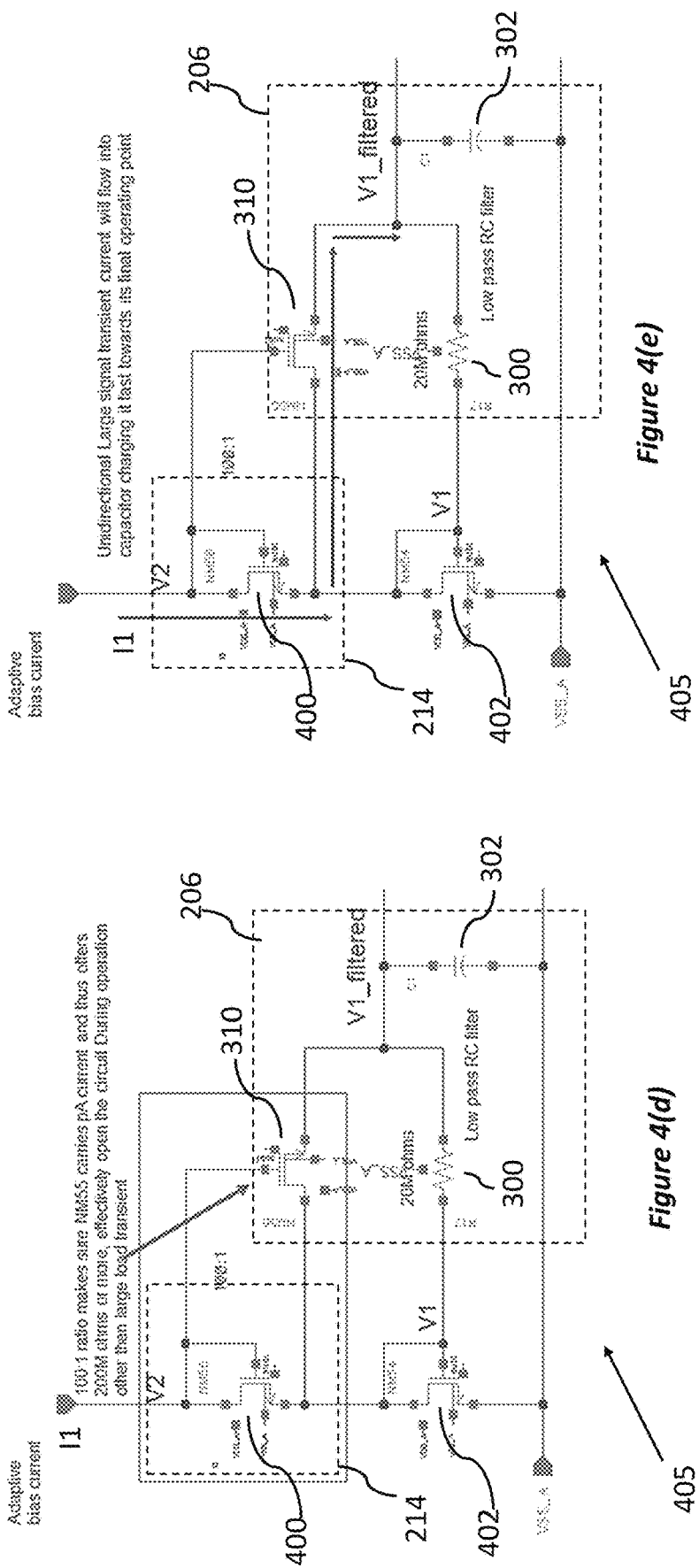
FIG. 4(d) is an alternative schematic of the filter circuit of FIG. 4(c)
FIG. 4(e) is a further schematic of the filter circuit of FIG. 4(c) showing a path of current flow during a phase of operation.

FIG. 4(d) is an alternative schematic of the filter circuit 405. FIG. 4(e) is a further schematic of the filter circuit 405 showing a path of current flow during a phase of operation. The following description relates to an example operation for a practical implementation of the filter circuit 405.

The transistors 310, 400 are NMOS devices, where the transistor 400 keeps the transistor 310 optimally biased at all times.

During DC and small signal operation the transistor 310 is effectively an open circuit with 200 MΩ, thus we have low bandwidth positive feedback through the RC filter 206. This provides a good phase margin and the system remains stable.

In a steady state mode of operation, the voltage V1_filtered=V1. A load current increase will increase adaptive bias current (here labelled I1) and V2 and V1 will jump higher than V1_filtered. The transistor 310 will see a large gate to source voltage and its ON resistance will reduce from 200 MΩ to 100 KΩ. This means the 20 MΩ resistance of resistor 300 is shorted by a very small 100 KΩ resistor allowing V1_filtered to rise very fast towards V1. Once V1_filtered is close to V1, the transistor 310 will again have a very high ON resistance of 200 MΩ effectively leaving 20 MΩ resistor 300.

A load current Iload decrease will decrease adaptive bias current (labelled here as I1) and V2 and V1 will jump lower. V2 will go lower and the transistor 310 will remain off, so the function of the transistor 310 shorting the RC filter 206 is unidirectional. Applied to the LDO 100, a bidirectional reduction in on resistance of the transistor 310 may lead to instability.

When load current Iload increases adaptive bias current I1 will increase and it will quickly charge the capacitor 302.

The filter circuit 405 does not take extra current so its suitable for nA IOT application or any other ultra-low IQ application.

In summary, embodiments of the present disclosure relate to a filter circuit that allows a bias current to track a fast increase in load current, but does not track a fast decrease in load current we can have fast stable transient performance.

Furthermore, embodiments of the present disclosure show a low pass filter that reduces the small signal AC bandwidth of the positive feedback loop to keep the system stable, but allows unidirectional large signal transients to go through. With this unique filter we can achieve a stable adaptive bias system with a fast transient response for systems such as the LDO 100.

It will be appreciated that embodiments of the filter circuit may be implemented as a low pass or a high pass filter for positive feedback, negative feedback or any other signal path because it is a fundamental building block that can, for example, unidirectionally feedforward large signal transient to achieve various goals. It will be appreciated that embodiments of the present disclosure may be applied to any circuit or system that uses adaptive biasing and needs a fast response.

Figure 5:
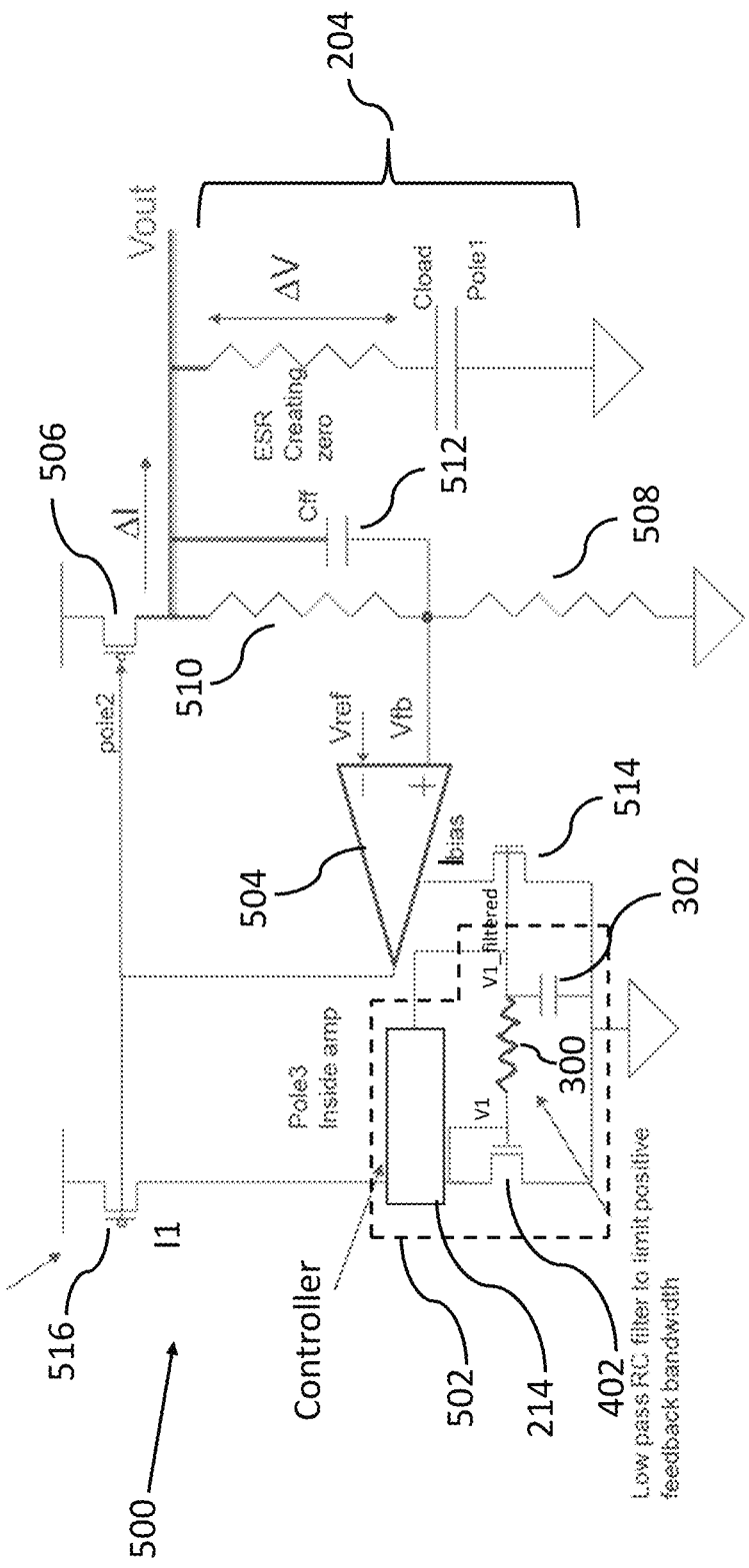
FIG. 5 is a schematic of an LDO using a filter circuit in accordance with a tenth embodiment of the present disclosure.

FIG. 5 is a schematic of an LDO 500 using a filter circuit 502 in accordance with a tenth embodiment of the present disclosure. It will be appreciated that the LDO 500 is a specific implementation of the system 202 as previously described. The LDO 500 may be a 30 nA LDO. The LDO provides an output voltage Vout, which may be referred to as an LDO voltage.

The LDO 500 comprises an amplifier 504; a transistor 506; resistive elements 508, 510; a stabilizing capacitor 512; and a bias current transistor 514; and a sensing transistor 516.

In operation, the bias current transistor 514 receives the voltage V1_filtered and generates the amplifier bias current Ibias. The first current I1 is provided by the sensing transistor 516.

This example shows how the filter circuit 502 does not change the filter's small signal or DC behaviour, but kicks in for a transient signal and boosts the filter bandwidth. In the present example, transient bandwidth boost is unidirectional to keep the system stable.

Figure 6A:
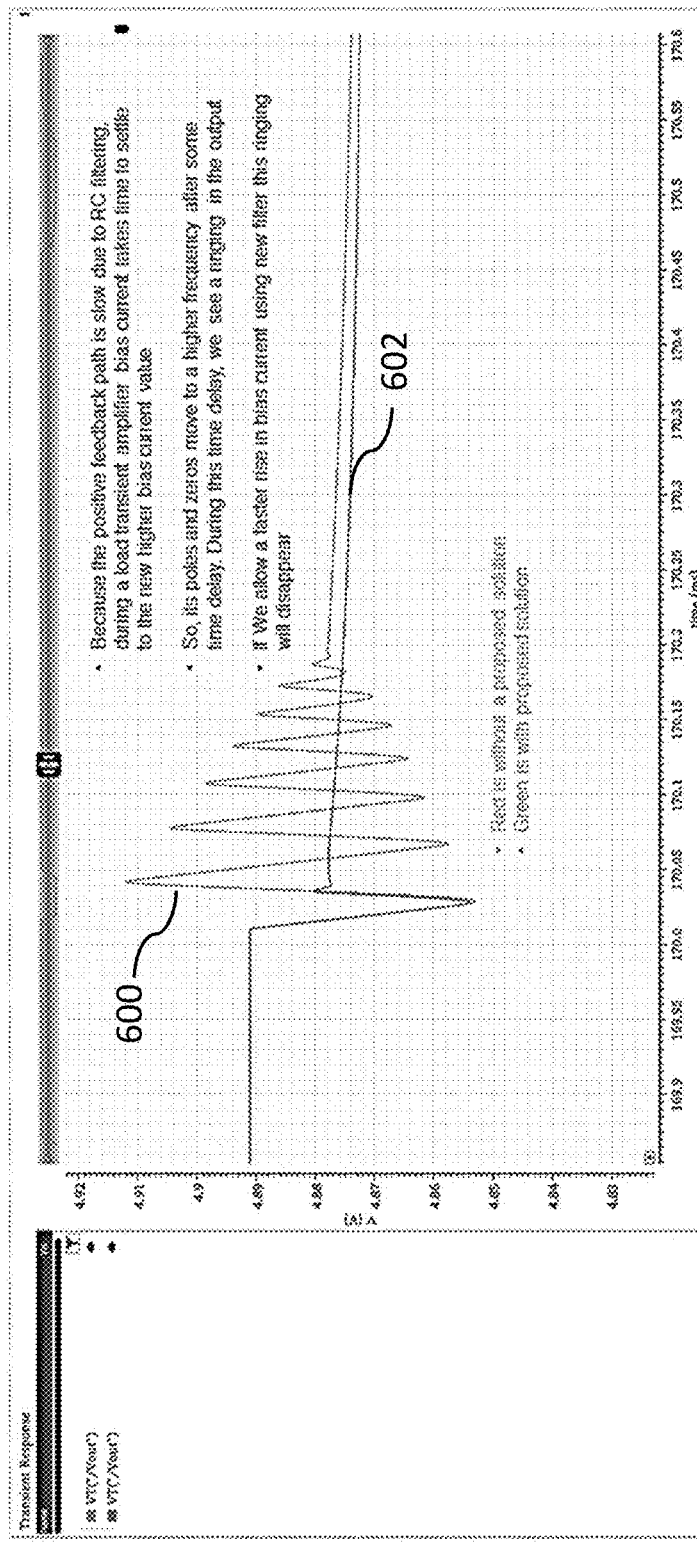
FIG. 6(a) is a graph showing simulation results for a practical implementation of the LDO of FIG. 1(a) and the LDO of FIG. 5.
Figure 6B:
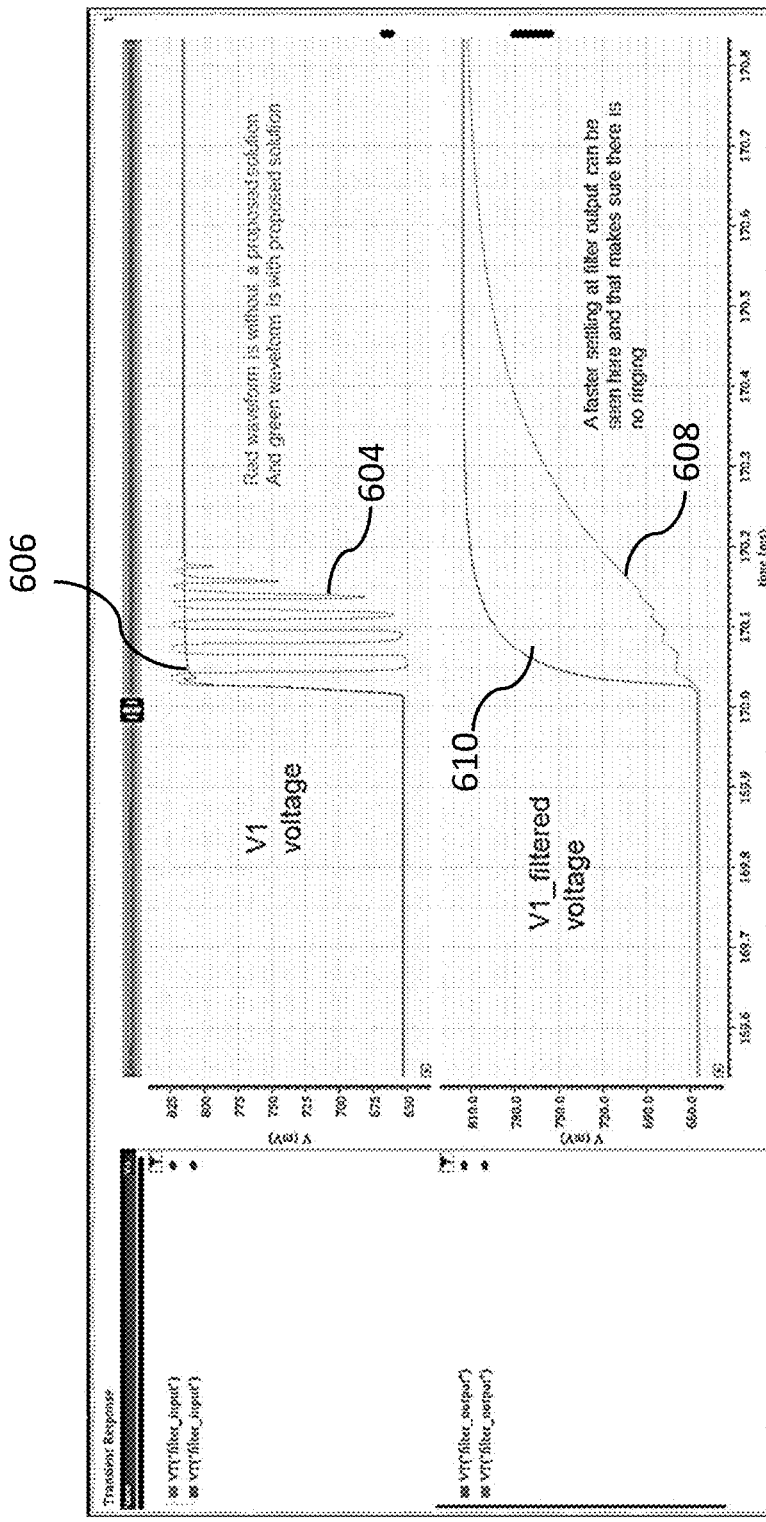
FIG. 6(b) is a graph showing further simulation results for a practical implementation of the LDO of FIG. 1(a) and the LDO of FIG. 5.

FIG. 6(*a*) is a graph showing simulation results for a practical implementation of the LDO 100 and the LDO 500. A trace 600 shows the output voltage Vout of the LDO 100 when there is a load transient, and a trace 602 shows the output voltage Vout of the LDO 500 when there is a load transient. It can be observed that the faster rise in bias current provided by the system of LDO 500 removes the ringing as is present on the output voltage Vout of the LDO 100.

FIG. 6(*b*) is a graph showing further simulation results for a practical implementation of the LDO 100 and the LDO 500. A trace 604 shows the voltage V1 for the LDO 100; a trace 606 shows the voltage V1 for the LDO 500; a trace 608 shows the voltage V1_filtered for the LDO 100; and a trace 610 shows the voltage V1_filtered for the LDO 500. It can be observed that the LDO 500, implementing an embodiment of the filter circuit of the present disclosure, provides a faster settling time at the filter output, thereby preventing ringing.

Common reference numerals or variables between Figures represent common features.

Various improvements and modifications may be made to the above without departing from the scope of the disclosure.

The invention claimed is:

1. A filter circuit for use with a system configured to be coupled with an electrical load, the filter circuit comprising:
    a first filter configured to receive a first voltage and provide an output voltage, the output voltage being the first voltage after filtering by the first filter; and
    a controller configured to:
        receive a first current, the first current being dependent on a load current;
        based on the first current received, detect a load transient by detecting a transient in the load current; and
        adjust a bandwidth of the first filter in response to the load transient detected.

2. The filter circuit of claim 1, wherein the first filter comprises one of:
    a high pass filter;
    a low pass filter;
    a bandstop filter; or
    a bandpass filter.

3. The filter circuit of claim 1, wherein the controller is configured to adjust the bandwidth of the first filter in response to a falling load transient and/or a rising load transient.

4. The filter circuit of claim 3, wherein the controller is configured to adjust the bandwidth of the first filter in response to the falling load transient or the rising load transient and to maintain the bandwidth at its current value in response to the other of the falling load transient or the rising load transient.

5. The filter circuit of claim 3, wherein the controller is configured to temporarily adjust the bandwidth of the first filter in response to a falling load transient and/or a load transient from a first value to a second value before returning the bandwidth to the first value.

6. The filter circuit of claim 5, wherein the processor is configured to:
    temporarily adjust the bandwidth of the first filter in response to the falling load transient or the rising load transient from a first value to a second value before returning the bandwidth to the first value; and
    maintain the bandwidth at the first value in response to the other of the falling load transient or the rising load transient.

7. The filter circuit of claim 1, configured to provide the output voltage that is dependent on the first current, wherein the system is configured to receive the output voltage and to generate a system bias current.

8. The filter circuit of claim 1, wherein:
    the first filter comprises a first switch; and
    the controller is configured to operate the first switch to bypass a portion of the first filter when the load transient is detected, thereby adjusting the bandwidth of the first filter in response to the load transient.

9. The filter circuit of claim 8, wherein:
    the controller comprises a first resistive element configured to receive the first current and to generate a second voltage; and
    the controller is configured to operate the first switch using the second voltage.

10. The filter circuit of claim 9, wherein the filter circuit is configured to receive the first voltage as generated by a second resistive element coupled in series with the first resistive element.

11. The filter circuit of claim 10, wherein:
    the first resistive element comprises a first resistive transistor configured to receive the first current and to generate the second voltage; and/or
    the second resistive element comprises a second resistive transistor configured to receive the first current and to generate the first voltage.

12. The filter circuit of claim 9, wherein the first filter comprises a low pass filter comprising:
   a first resistor; and
   a first capacitor, wherein the first resistor comprises a first terminal configured to receive the first voltage and a second terminal coupled to a first terminal of the first capacitor and configured to provide the output voltage.

13. The filter circuit of claim 1, wherein the system configured to be coupled with an electrical load comprises a low dropout regulator for providing an LDO voltage.

14. An apparatus comprising:
   a system configured to be coupled with an electrical load; and
   a filter circuit comprising:
      a first filter configured to receive a first voltage and provide an output voltage, the output voltage being the first voltage after filtering by the first filter; and
      a controller configured to:
         receive a first current, the first current being dependent on a load current;
         based on the first current received, detect a load transient by detecting a transient in the load current; and
         adjust a bandwidth of the first filter in response to the load transient detected.

15. A method performed by a filter circuit used with a system coupled with an electrical load, the method comprising:
   receiving, by a filter of the first circuit, a first voltage;
   providing, by the filter, an output voltage using the first filter, the output voltage being the filtered first voltage;
   receiving, by a controller of the filter circuit, a first current, the first current being dependent on a load current;
   based on the first current received, detecting, by the controller, a load transient by detecting a transient in the load current; and
   adjusting, by the controller, a bandwidth of the first filter in response to the load transient detected.

* * * * *